United States Patent
Igel et al.

[11] Patent Number: 6,028,009
[45] Date of Patent: Feb. 22, 2000

[54] PROCESS FOR FABRICATING A DEVICE WITH A CAVITY FORMED AT ONE END THEREOF

[75] Inventors: Guenter Igel, Teningen; Martin Mall, Freiburg, both of Germany

[73] Assignee: Micronas Intermetall GmbH, Freiburg, Germany

[21] Appl. No.: 09/061,439

[22] Filed: Apr. 16, 1998

[30] Foreign Application Priority Data

Apr. 19, 1997 [DE] Germany ............... 197 16 480

[51] Int. Cl.⁷ ............... H01L 21/00; H01P 5/00
[52] U.S. Cl. ............... 438/739; 438/740; 216/24
[58] Field of Search ............... 216/2, 24, 56, 216/62, 87; 438/735, 739, 740; 385/14, 15, 76–89; 359/290

[56] References Cited

U.S. PATENT DOCUMENTS

| | | | |
|---|---|---|---|
| 5,324,683 | 6/1994 | Fitch et al. | 437/65 |
| 5,631,988 | 5/1997 | Swirhun et al. | 385/89 |
| 5,683,546 | 11/1997 | Manaka | 156/643.1 |

FOREIGN PATENT DOCUMENTS

| | | |
|---|---|---|
| 4446509 | 6/1996 | Germany . |
| 19536250 | 4/1997 | Germany . |

OTHER PUBLICATIONS

G. Benz, Optoelektronische Mikrosysteme, Elektronik 21/1993, pp. 134 et seq.

A. Heuberger, "Mikromechanik", Springer Verlag 1991, pp. 432 et seq.

German Search Report for Application No. 197 16 480.3–33 dated May 5, 1997.

Primary Examiner—Bruce Breneman
Assistant Examiner—Alva C. Powell
Attorney, Agent, or Firm—Arthur L. Plevy

[57] ABSTRACT

A process is disclosed for fabricating a device with a cavity formed at one end thereof. A body is provided with a depression, and mask layer is applied to the surface of the body and the depression, the mask layer having a lower etch rate than the body. Near the depression, an opening is formed in the mask layer. Starting from the opening, the body is subjected to an isotropic etching process to form the cavity below the mask layer, with the mask layer being essentially preserved and forming in the area of the depression a structure extending into the cavity.

20 Claims, 2 Drawing Sheets

PROCESS FOR FABRICATING A DEVICE WITH A CAVITY FORMED AT ONE END THEREOF

BACKGROUND OF THE INVENTION

1. Field of the Invention

This invention relates to a process for fabricating a device with a cavity formed at one end thereof.

2. Description of Related Art

A device for receiving an optical fiber is disclosed in DE 44 46 509. A substrate is provided with V-grooves which contain the optical fibers. To form electrical contacts near the optical fibers, complex deposition and etching processes must be carried out.

Another device for receiving optical fibers is known from A. Heuberger, "Mikromechanik", Springer Verlag 1991, pp. 432 et seq. A body is provided with V-shaped moats into which the optical fibers are fitted. To align the optical fibers, a second body with V-shaped moats is placed on the first body, so that the optical fibers are securely held in a sandwich-like structure. These two bodies are joined together.

The known devices for receiving optical fibers have the disadvantage that the fixing of the optical fibers at the body and forming a suitable cavity in the body is complicated and costly. To fix the fibers in the vertical, a separate cover must be produced and put on. Aligning the fiber ends in the horizontal with respect to a predetermined position is only possible with large error tolerances. Furthermore, the contact surfaces of the optical fibers in the V-shaped moats are small, so that mechanical stresses are induced in the optical fiber. The formation of electrical contacts near the fiber ends is complicated.

It is the object of the invention to provide a process with which a device having a cavity formed at one end thereof can be fabricated in a simple manner.

SUMMARY OF THE INVENTION

Briefly described, the invention comprises a process involving the steps of forming a depression in a body; applying a mask layer to the surface of the body and the depression, the mask layer having a lower etch rate than the body; forming an opening in the mask layer near the depression; and, starting from the opening, subjecting the body to an isotropic etching process to form the cavity below the mask layer, with the mask layer being essentially preserved; and forming at the end of the cavity in the area of the depression a structure extending into the cavity.

The device can be used for various applications, particularly in microsystems electronics. It can be employed as a sensor by forming the structure in an appropriate manner and providing it with a detector. The structure can, for example, be made transparent to light to permit optical examinations, or be designed as a diaphragm for pressure measurements. The substance to be examined is then introduced into the space at the end of the cavity. The cavity can also be used to receive objects, such as optical fibers.

In the process according to the invention, a cavity is formed by etching. The cavity is bounded at the top by the mask layer. With an isotropic etching process, the cavity is given an approximately circular cross section. The structure extending into the cavity at one end thereof is formed during the etching process because of the depression provided in the mask layer, since the mask layer is essentially preserved. If an object, particularly an optical fiber, is introduced into the cavity, it will have a large bearing surface in the cavity, so that lower mechanical stresses will be induced. The mask layer then serves to align the optical fiber. On the one hand, it fixes the optical fiber at the body in the vertical, so that no additional cover for the optical fiber need be produced separately for and placed on the optical fiber, and complex process steps are avoided. On the other hand, the structure formed by the mask layer in the area of the depression constitutes a mechanical stop for the optical fiber, so that the fiber end can be very accurately aligned in the horizontal. To do this, the optical fiber is inserted into the cavity until it abuts on the mechanical stop.

In the preferred embodiment of the invention, an opening is formed in the mask layer on each side of the depression, with the body being subjected to the etching process starting from the openings in such a manner that a cavity is formed on each side of the depression and that in the area of the depression, the mask layer forms a structure extending into the space between the cavities. This structure may serve as a spacer for objects introduced into the cavities. Such a spacer is particularly advantageous if the device is used to receive optical fibers, because the ends of two facing optical fibers can then be aligned very accurately with respect to each other. This is essential for achieving efficient coupling between two optical fibers. This coupling efficiency decreases rapidly with the normalized distance, i.e., the ratio of the distance to the diameter of the optical fiber. This is stated, for example, in H. Reichel, "Microsystem Technologies", 1992, VDE Verlag, pp. 301 et seq. Since, according to the invention, a spacer for holding the ends of two facing optical fibers at a very small distance from each other can be implemented using methods employed in microsystems electronics, efficient coupling can be achieved between two optical fibers.

In another preferred embodiment of the invention, several openings are formed in the mask layer which are located on a straight line and whose spacing is chosen so that in the etching process, a straight cavity is formed on at least one side of the depression. During the etching process, the etch fronts, which propagate in the body starting from openings lying side by side, overlap. Thus, a long cavity with a uniform cross section is formed. In this cavity, optical fibers can be fixed securely in place.

In a further embodiment of the invention, the openings in the mask layer are slotshaped, with their longitudinal axes extending in the direction of the respective cavities to be formed.

According to a further embodiment of the invention, a solid object, particularly an optical fiber, which is introduced into the cavity can be fixed in the area of the openings. The fixing can be done mechanically, for example by providing a spring, or chemically, for example by adhesive bonding or by vapor-depositing on the cladding of the optical fiber a material which combines with the cladding and the mask layer.

In a further embodiment of the invention, a gaseous, liquid, or solid material can be introduced through one or more openings in the mask layer into the space below the depression. The properties of the material introduced can then be measured by, e.g., chromatography. With this process, very small quantities can be enclosed in the space below the depression at the end of one or two optical fibers, so that specific properties of very small quantities, such as drops of a liquid, can be measured. A powder or a wire can also be introduced for examination.

Electrical contacts can be formed on the mask layer in a simple manner, because the surface of the body remains nearly flat. This makes it possible to provide the contacts in close proximity to objects introduced into the cavity, such as optical fibers. This is particularly advantageous in the case of optoelectronic devices.

In a further embodiment of the invention, the structure is formed with a diaphragm in the depression. The device can then be used as a pressure sensor, for example. To form the structure, the material of the mask layer in the area of the depression may be different from the mask layer material outside this area. A magnetically active material may be used, for example. A diaphragm is thus formed which can be moved by means of a magnet. Furthermore, in the area of the depression, the structure may be made transparent to light. In that case, a material introduced into the interior of the device can be excited by light, or light scattered by this material can be measured. An active or passive element can be provided in the area of the structure. If the structure is transparent in the area of the depression, an optical sensor can be arranged to measure changes in the intensity or phase of the light. Light can be fed in and conducted away through optical fibers introduced into the cavities. The structure then serves as a spacer.

In still another embodiment of the invention, the substrate is a semiconductor wafer. On the semiconductor wafer, further structures can be formed. Contacts, electronic structures, and circuit arrangements can be formed on the semiconductor wafer using conventional semiconductor processes. The mask layer may be of aluminum, and the etch stop layer of silicon oxide. The silicon-oxide layer may then be covered with a material other than the semiconductor material. The material will be chosen depending on its etching properties and on the desired diameter of the cavities.

The invention will now be explained in more detail with reference to the accompanying drawings.

DETAILED DESCRIPTION OF THE INVENTION

Figure 1:
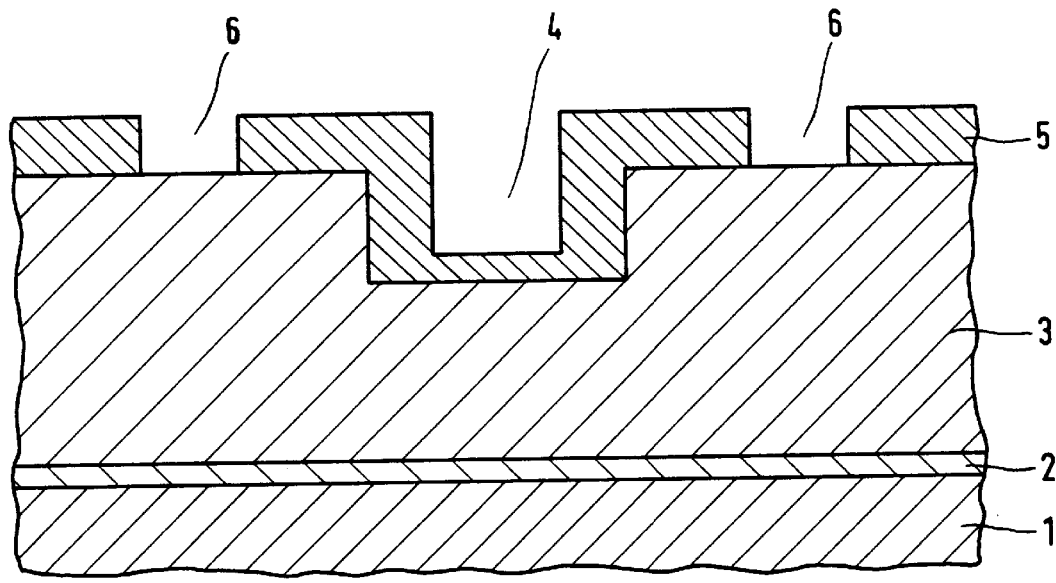
FIG. 1 shows an embodiment of a device made by the process according to the invention.

In the following, the process according to the invention is described with the aid of the embodiment shown in FIG. 1. A semiconductor wafer 1 is covered with an etch stop layer 2. The semiconductor wafer 1 may be a silicon wafer, and the etch stop layer a silicon-oxide layer. The etch stop layer 2 is covered with a layer 3 of a material which has a higher etch rate than the etch stop layer 2. This layer 3 may be made of silicon, for example. A depression 4 is formed in the layer 3. The layer 3 and the depression 4 are provided with a mask layer 5. Openings 6 are formed in the mask layer 5.

Figure 2:
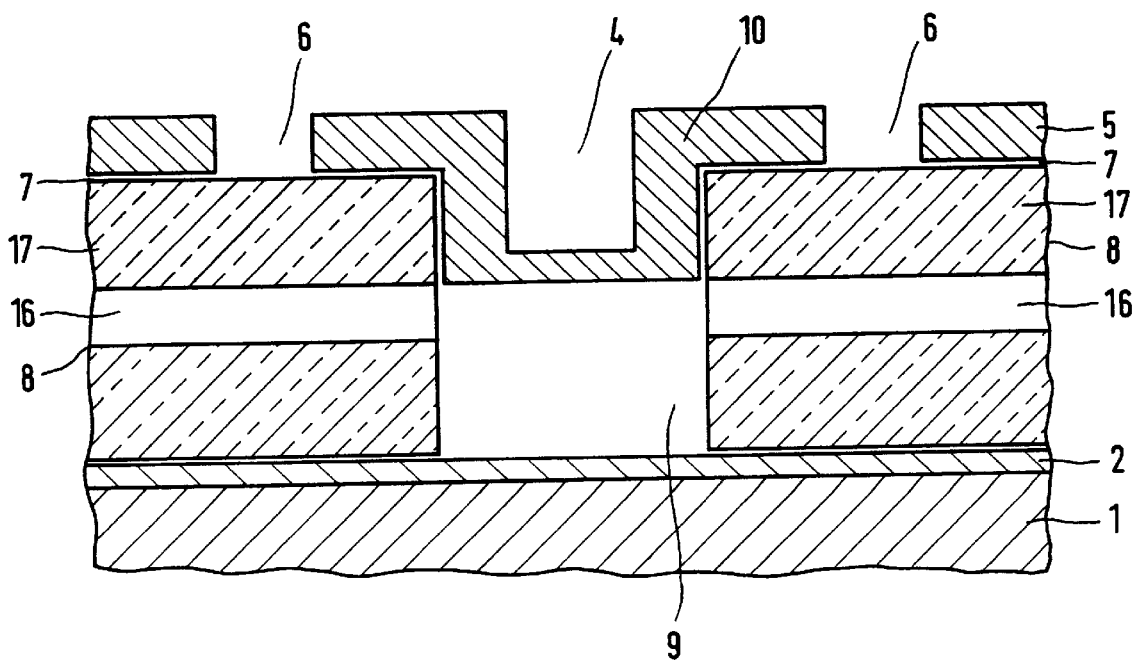
FIG. 2 is an alternate embodiment of the device made by the process according to the invention for receiving optical fibers.

Referring to FIG. 2, starting from the openings 6, the semiconductor wafer 1 is subjected to an isotropic etching process. In this etching process, the layer 3 is removed to form cavities 7 into which an arbitrary material or a suitable object can later be introduced. During the etching process, the mask layer 5 and the etch stop layer 2 form the boundary of the cavities 7. In the area of the depression 4, the mask layer 5 forms a structure 10 which extends into the space between the cavities 7. The structure may serve as a spacer for objects introduced into the cavities, e.g., for optical fibers 8.

In FIG. 2, this is illustrated by the example of optical fibers 8. The latter are introduced into the cavities 7 until they abut on the spacer 10. Thus, the distance between the ends of the optical fibers 8, which each have a core 16 and a cladding 17, is defined by the cross section of the depression 4. Since the semiconductor wafers can be processed with microsystem technology, this distance can be very small and be defined very accurately, so that the efficiency of the coupling between the cores 16 of the optical fibers 8 is precisely adjustable.

The device shown in FIG. 2 can be used to couple two optical fibers 8. Two or more such devices may, of course, be set together. The device can also be used as a sensor. In that case, the space 9 below the depression 4 is used as a measuring space. A material to be examined, which may be gaseous, liquid, or solid, can be introduced into this space. The spacer 10 can be designed in a manner suitable for the desired purpose. It may be made of a permeable material, for example.

Figure 3:
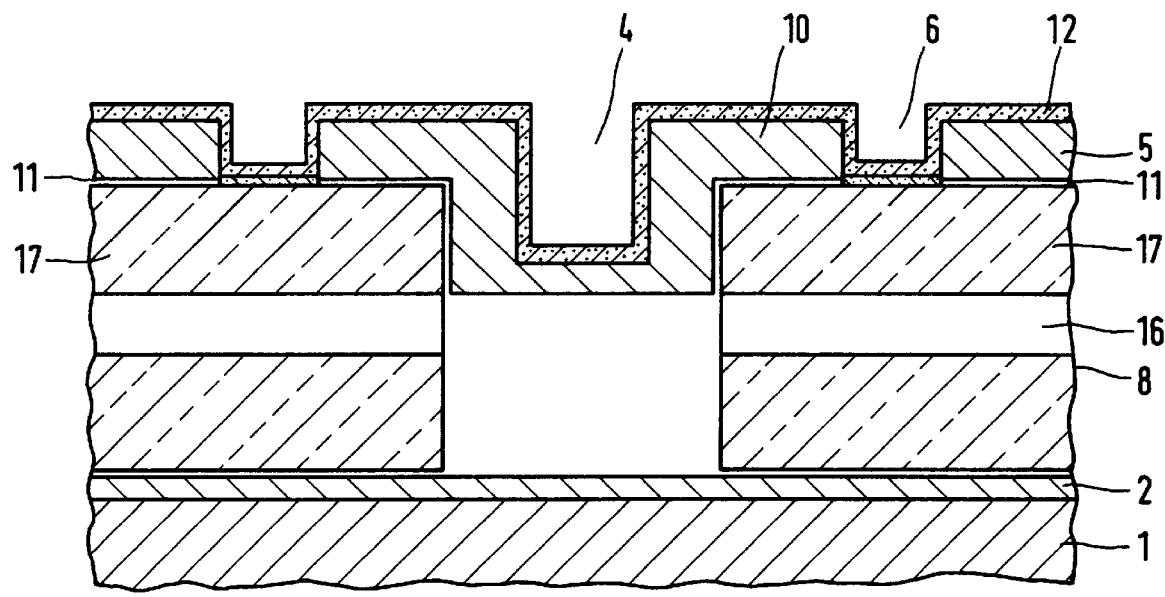
FIG. 3 is an alternate embodiment of the device made by the process according to the invention for receiving optical fibers.

The optical fibers 8 can be fixed in the cavities 7. FIG. 3 shows an embodiment in which an adhesive layer 11 is deposited on the cladding 17 of the respective optical fiber 8 within the openings 6. A fixing layer 12 is deposited over the surface of the mask layer 5 and the adhesive layer 11, so that a strong bond is provided between the cladding 17 of the respective optical fiber 8 and the mask layer 5.

Figure 4:
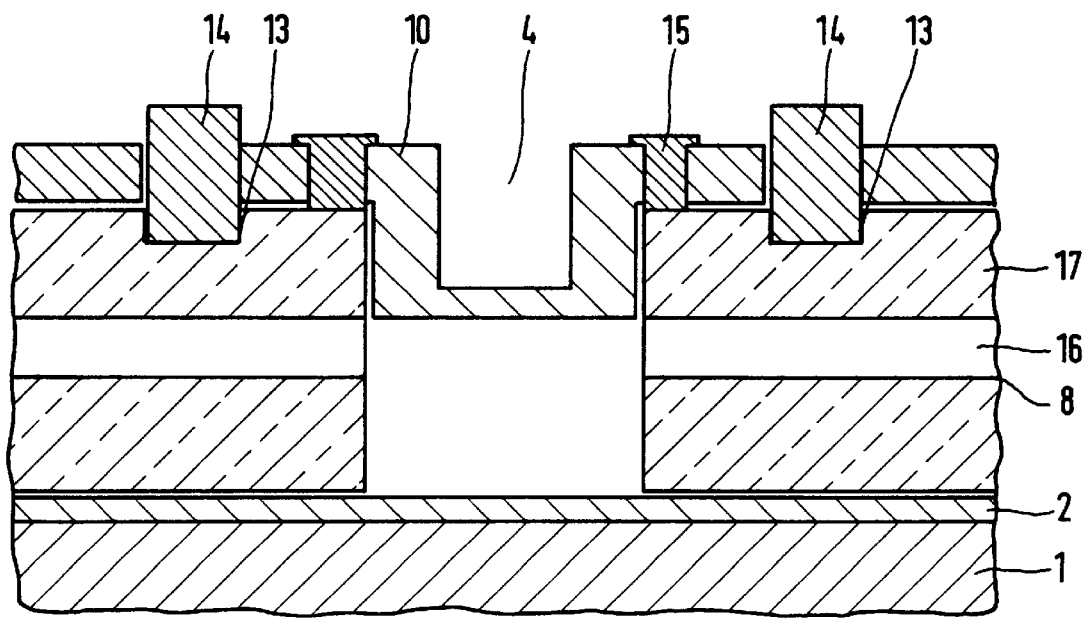
FIG. 4 is an alternate embodiment of the device made by the process according to the invention for receiving optical fibers.

FIG. 4 shows a further embodiment of a device made by the process according to the invention. The optical fibers 8 are held in the cavities 7 by means of fixing pins 14 inserted into depressions 13 formed in the respective claddings 17 of the optical fibers 8. At the ends of the optical fibers 8, electrical contacts 15 were formed by conventional semiconductor processes.

While the invention has been described with reference to the preferred embodiment thereof, it will be appreciated by those of ordinary skill in the art that modifications can be made to the parts that comprise the invention without departing from the spirit and scope thereof, which is defined solely by the appended claims.

What is claimed is:

1. A process for fabricating a device with a cavity formed at one end thereof, comprising the steps of:
    forming a depression in a body;
    applying a mask layer to the surface of the body and the depression, the mask layer having a lower etch rate than the body;
    forming an opening in the mask layer near the depression; and
    subjecting the body to an isotropic etching process starting from the opening to form a cavity below the mask layer, with the mask layer being essentially preserved;
    wherein, said mask layer forms a structure extending into the cavity in the area of the depression.

2. The process as claimed in claim 1, further comprising the steps of:
    forming another opening in the mask layer on a different side of the depression; and,
    subjecting the body to the etching process starting from the openings, wherein at least two cavity portions are respectively formed on different sides of the depression, each for respectively receiving an optical fiber, and wherein in the area of the depression, the structure formed by the mask layer extends into a space between the cavity portions formed on different sides of the depression.

3. The process as claimed in claim 1, further comprising the step of: forming a plurality of openings in the mask layer which are located along a straight line and whose spacing is chosen so that during the etching process, a cavity extending along the straight line is formed on at least one side of the depression.

4. The process as claimed in claim 2, wherein said openings in the mask layer are located along a straight line and the spacing thereof is chosen so that during the etching process, a cavity extending along the straight line is formed on at least one side of the depression.

5. The process as claimed in claim 3, wherein the plurality of openings formed in the mask layer are slot-shaped, with their longitudinal axis extending in a direction of the respective cavity to be formed.

6. The process as claimed in claim 1, further comprising the step of forming an etch stop layer on said body, wherein the etch stop layer forms a boundary of the cavity toward an interior of the body.

7. The process as claimed in claim 2, wherein an optical fiber is respectively fixed in place in one of said cavity portions in an area of the openings.

8. The process as claimed in claim 1, wherein a gaseous material is introduced through said opening in the mask layer into said cavity in a space below the depression.

9. The process as claimed in claim 1, wherein a liquid material is introduced through said opening in the mask layer into said cavity in a space below the depression.

10. The process as claimed in claim 1, wherein a solid material is introduced through said opening in the mask layer into a space below the depression.

11. The process as claimed in claim 1, further comprising the step of forming electrical contacts on the mask layer.

12. The process as claimed in claim 1, further comprising the step of forming a diaphragm in the depression.

13. The process as claimed in claim 12, wherein the mask layer is formed of a different material in the area of the depression than outside the area of the depression.

14. The process as claimed in claim 13, wherein in the area of the depression, the structure is permeable.

15. The process as claimed in claim 14, wherein an active element is provided in the area of the structure.

16. The process as claimed in claim 14, wherein a passive element is provided in the area of the structure.

17. The process as claimed in claim 1, further comprising the step of forming said body on a substrate, wherein a semiconductor wafer is used as said substrate.

18. The process as claimed in claim 17, further comprising the step of forming additional structures on the semiconductor wafer.

19. A method for fabricating a device having at least one cavity adapted to receive at least one fiber optic cable, said method comprising the steps of:

forming a depression in a first surface of a body;

applying a mask layer to said first surface of the body and the depression, the mask layer having a lower etch rate than the body;

forming at least one opening in the mask layer near the depression; and, isotropically etching said body to form a cavity below the mask layer, with the mask layer being essentially preserved;

wherein, said mask layer forms a structure extending into the cavity in an area of the depression.

20. The method of claim 19, further comprising the step of forming at least a second opening in the mask layer on a different side of the depression from said first opening, wherein at least first and second cavity portions are formed on different sides of the depression, each of said first and second cavity portions being respectively adapted for receiving a fiber optic cable, and wherein the structure extending into said cavity in the area of the depression extends into a space between the first and second cavity portions.

* * * * *